United States Patent [19]

Lee et al.

[11] Patent Number: 5,315,173
[45] Date of Patent: May 24, 1994

[54] DATA BUFFER CIRCUIT WITH DELAY CIRCUIT TO INCREASE THE LENGTH OF A SWITCHING TRANSITION PERIOD DURING DATA SIGNAL INVERSION

[75] Inventors: Seung-keun Lee; Choong-keun Kwak; Chang-rae Kim, all of Seoul, Rep. of Korea

[73] Assignee: Samsung Electronics Co., Ltd., Kyunggi-do

[21] Appl. No.: 898,535

[22] Filed: Jun. 15, 1992

[30] Foreign Application Priority Data

Jul. 19, 1991 [KR] Rep. of Korea ............. 91-12384

[51] Int. Cl.⁵ ............... H03K 5/12; H03K 19/0948
[52] U.S. Cl. ........................... 307/443; 307/451; 307/263
[58] Field of Search ............. 307/263, 443, 451

[56] References Cited

U.S. PATENT DOCUMENTS

| | | | |
|---|---|---|---|
| 4,612,466 | 9/1986 | Stewart | 307/451 |
| 4,825,101 | 4/1989 | Walters, Jr. | 307/451 |
| 4,827,159 | 5/1989 | Naganuma | 307/451 |
| 4,859,870 | 8/1989 | Wong et al. | 307/451 |
| 4,877,980 | 10/1989 | Kubinec | 307/451 |
| 4,880,997 | 11/1989 | Steele | 307/263 |
| 5,175,445 | 12/1992 | Kinugasa et al. | 307/451 |

FOREIGN PATENT DOCUMENTS

| | | |
|---|---|---|
| 0251275 | 6/1987 | European Pat. Off. |
| 0251910 | 6/1987 | European Pat. Off. |
| 1042558 | 7/1965 | United Kingdom |
| 2184622 | 12/1985 | United Kingdom |

*Primary Examiner*—Edward P. Westin
*Assistant Examiner*—Benjamin D. Driscoll
*Attorney, Agent, or Firm*—Cushman, Darby & Cushman

[57] ABSTRACT

A data output buffer includes a data driving circuit having a pull-up transistor responsive to a first signal and a pull-down transistor responsive to a second signal, a first control circuit for regulating the slope of the first signal to be less steep after reaching the threshold of the pull-up transistor than before reaching the threshold of the pull-up transistor, and a second control circuit for regulating the slope of the second signal to be less steep after reaching the threshold of the pull-down transistor than before reaching the threshold of the pull-down transistor. As a result, noise generated by the transition of the output signal of the data output buffer is reduced without affecting operation speed.

14 Claims, 6 Drawing Sheets

DATA BUFFER CIRCUIT WITH DELAY CIRCUIT TO INCREASE THE LENGTH OF A SWITCHING TRANSITION PERIOD DURING DATA SIGNAL INVERSION

BACKGROUND OF THE INVENTION

The present invention relates to a semiconductor memory device, and more particularly to a data output buffer of a semiconductor memory device. Along with the high integration and high speed of semiconductor memory devices comes the generation of noise in a chip, which causes malfunction thereof and lowers its reliability. There are many reasons for the generation of noise in a chip, but noise generated during data operation in a data output buffer is especially serious. The noise generated in data operations is due to the sudden and drastic change of data from low logic states to high logic states and vice versa.

SUMMARY OF THE INVENTION

Accordingly, it is an object of the invention to provide a data output buffer for reducing noise by controlling the slope of its output signal when changing logic states.

In order to accomplish the above-stated object, a data output buffer according to the invention comprises a data driving circuit having a pull-up means responding to a first signal and a pull-down means responding to a second signal, and a first control means for regulating the slope of the first signal to be less steep after reaching the threshold of the pull-up means than before, and a second control means for regulating the slope of the second signal to be less steep after reaching the threshold of the pull-down means than before.

BRIEF DESCRIPTION OF THE DRAWINGS

The above object and other advantages of the present invention will become more apparent by describing in detail the preferred embodiment with reference to the attached drawings, in which.

DETAILED DESCRIPTION OF THE INVENTION

Before describing a data output buffer according to this invention, a description of a conventional data output buffer is given as follows, in reference with the accompanying drawings.

Figure 1:
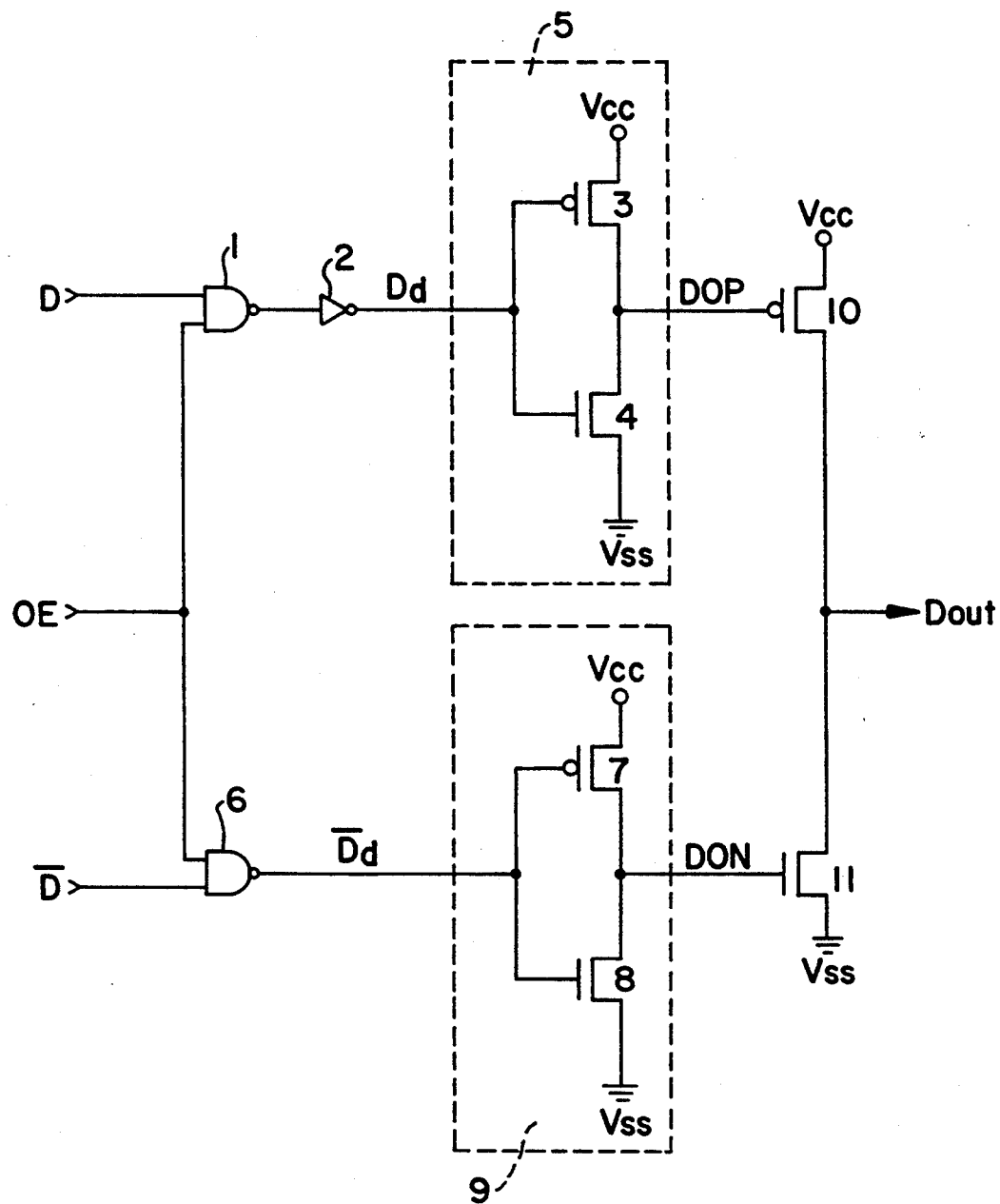
FIG. 1 shows a conventional data output buffer.

FIG. 1 shows a conventional data output buffer. Here, a data pair D and $\overline{D}$ are output signals from a sense amplifier (not shown) and the output enable signal OE is a signal for enabling output of data pair D and $\overline{D}$.

The data output buffer shown in FIG. 1 comprises:

a data input buffer which consists of a NAND gate 1 receiving data D and output enable signal OE, an inverter 2 for inverting the output of NAND gate 1, an inverter 5 composed of a PMOS transistor 3 having a gate electrode receiving the output signal of inverter 2 and a source electrode applied with a voltage source Vcc and an NMOS transistor 4 also having a gate electrode receiving the output signal of inverter 2, a source electrode connected to a ground potential Vss, and a drain electrode connected to the drain electrode of PMOS transistor 3;

an inverting data input buffer which consists of a NAND gate 6 receiving inverted data $\overline{D}$ and output enable signal OE, and an inverter 9 composed of a PMOS transistor 7 having a gate electrode receiving the output signal of NAND gate 6, a source electrode applied with voltage source Vcc, and an NMOS transistor 8 having a gate electrode receiving the output signal of NAND gate 6, a source electrode connected to a ground potential Vss, and a drain electrode connected to the drain electrode of PMOS transistor 7; and a data output driver consisting of a PMOS transistor 10 having a gate electrode receiving the output signal DOP of the inverter 5 and a source electrode applied with voltage source Vcc and an NMOS transistor 11 having a gate electrode receiving the output signal DON of inverter 9, a source electrode connected to ground potential Vss, and a drain electrode connected to the drain electrode of PMOS transistor 10 and generating data output signal Dout through the common node between NMOS transistor 11 and PMOS transistor 10.

Figure 2A:
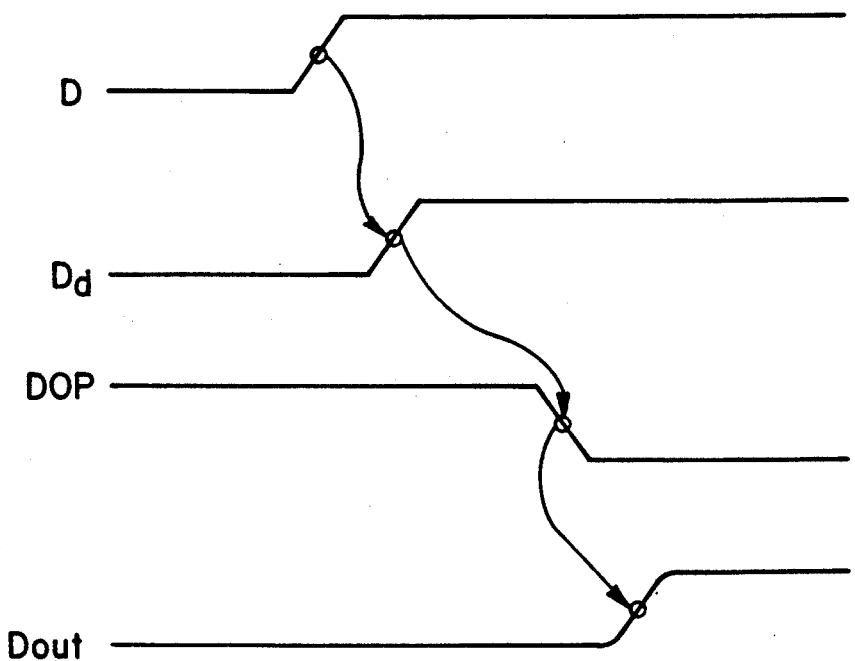
FIGS. 2A and 2B are operational timing diagrams for describing the operation of the circuit shown in FIG. 1.

FIG. 2A is an operational timing diagram for describing the operation of the circuit shown in FIG. 1 when data D transits from logic low to logic high. The above output enable signal OE is assumed to be high.

The logic high data D transits to logic low through NAND gate 1 and transits again to a logic high through inverter 2. This turns on NMOS transistor 4 of inverter 5, pulling down output signal DOP.

The data input buffer inverts a logic high data D to a logic low through NAND gate 1, inverts the logic low signal back to a logic high signal D through inverter 2, and outputs a logic low output signal DOP by inverting the logic high signal through inverter 5. At the same time, output signal DON of inverted data input buffer also becomes low. The logic low output signal DOP turns on PMOS transistor 10 of the data output driver, while the logic low output signal DON turns off NMOS transistor 11. This results in data output buffer signal Dout being a logic high signal.

Here, data D is delayed and outputted by the respective gate delay times of NAND gate 1, inverter 2, inverter 5, and the gates of the data output driver.

Figure 2B:
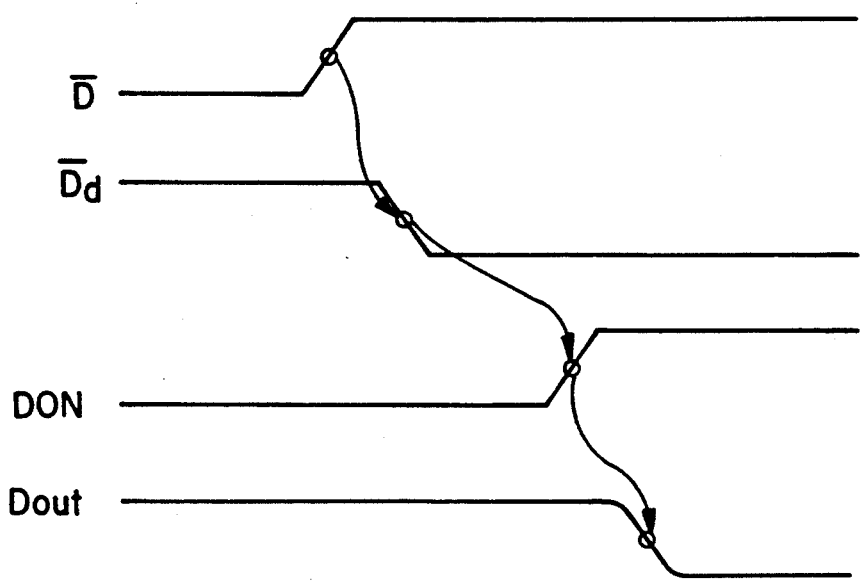

FIG. 2B is an operational timing diagram for describing the operation of the circuit shown in FIG. 1 when the inverted data $\overline{D}$ transits from low level to high level. Here again, output enable signal OE is assumed to be high level signal.

The inverting data input buffer inverts inverted data $\overline{D}$ of a high level to a logic low level signal through NAND gate 6, inverts the logic low level signal D through inverter 9, outputting a logic high level output signal DON. At the same time, the output signal DOP of data input buffer 5 also becomes high. The logic high level output signal DON turns on NMOS transistor 11 of the data output driver, while the logic high level output signal DOP turns off PMOS transistor 10, changing data output signal Dout to be a logic low signal.

Here, inverted data $\overline{D}$ is delayed and outputted by the respective gate delay times of NAND gate 6, inverter 9, and the gates of the data output driver.

Therefore, as shown in FIG. 2A and FIG. 2B, when output signal DOP of inverter 5 transits from high level to low level or when output signal DON of inverter 9 transits from low level to high level, because the voltage swings of output signals DOP and DON and their corresponding slopes are large, the slope of data output signal Dout changing from low to high or vice versa through the large channel of PMOS transistor 10 or NMOS transistor 11 of the data output driver is steep, which results in the generation of noise. This noise causes malfunction in the chip, and lowers reliability.

Here, the slopes of output signals DOP and DON are determined by the degree to which the channels of the pull-down transistor 4 of inverter 5 and pull-up transistor 7 of inverter 9, respectively, are opened.

The description of a data output buffer according to this invention in reference with the accompanying diagrams is as follows.

Figure 3:
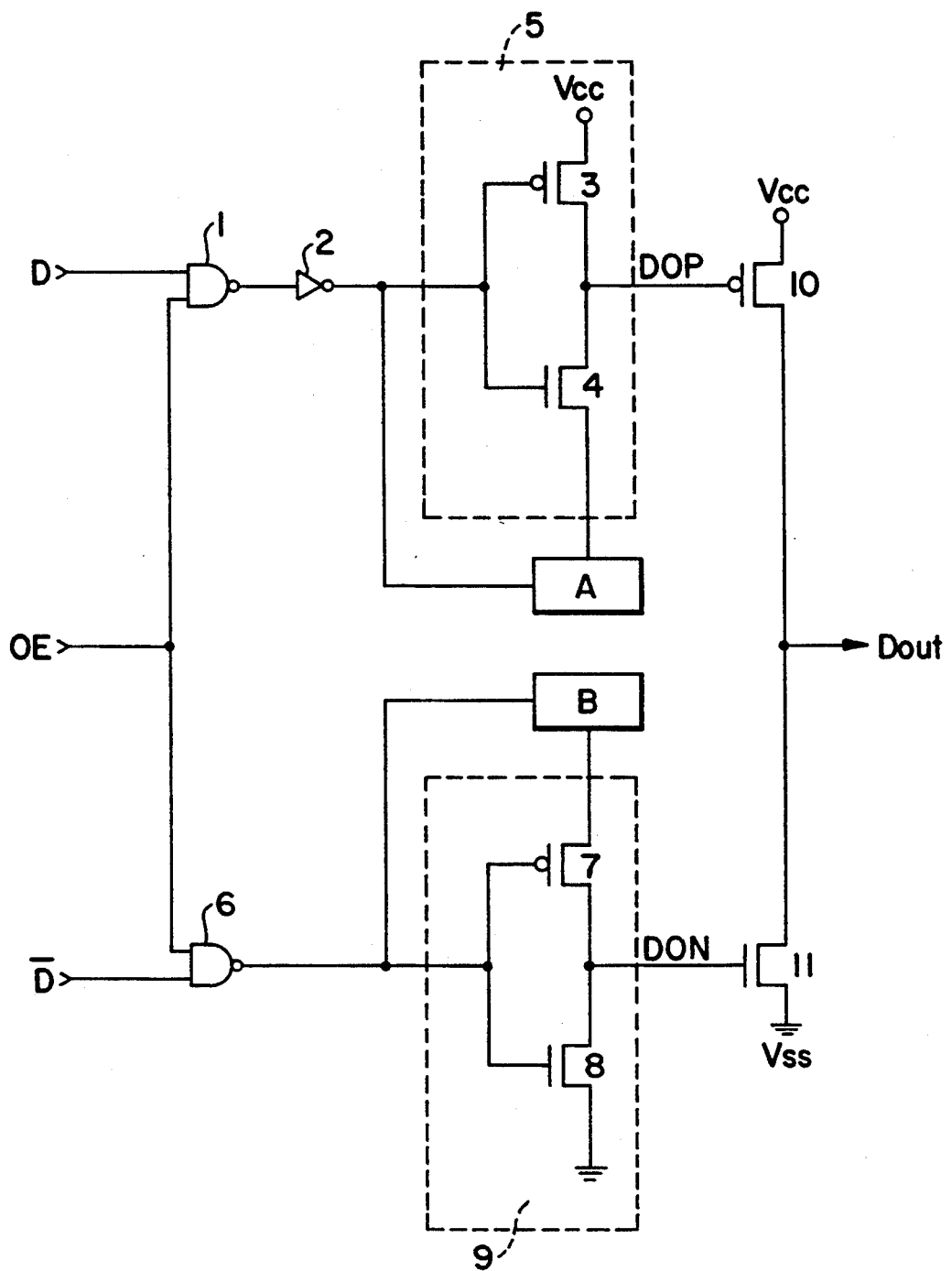
FIG. 3 schematically illustrates a data output buffer according to this invention.

FIG. 3 illustrates the concept of a data output buffer according to this invention. In FIG. 3, a data output buffer according to this invention further comprises, as compared with the circuit shown in FIG. 1, a first control circuit A connected to the output terminal of inverter 2 and the source electrode of NMOS transistor 4, for delaying the transition of output signal DOP of inverter 5 during a transition from high to low, and a second control circuit B connected to the output terminal of NAND gate 6 and the source electrode of PMOS transistor 7, for delaying the transition of output signal DON of inverter 9 during a transition from low to high.

Figure 4:
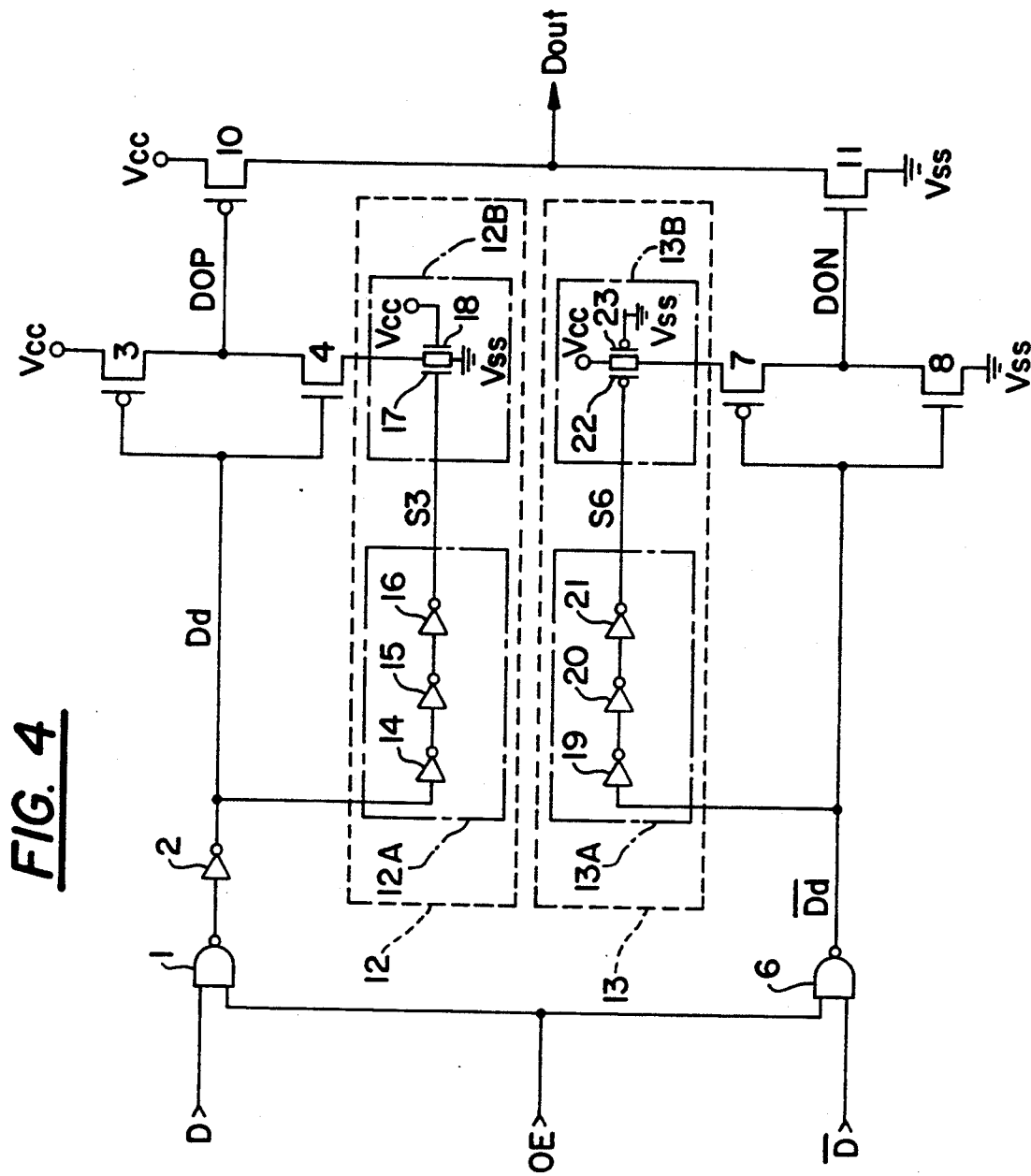
FIG. 4 shows an embodiment of a data output buffer according to this invention.

FIG. 4 illustrates an embodiment of the data output buffer according to this invention. In FIG. 4, a first control circuit 12 comprises a first delay portion 12A and a first slope control portion means 12B. The first delay portion 12A comprises a first inverter 14 receiving an output signal Dd from inverter 2, and second and third inverters 15 and 16 all connected in series with the first inverter 14. The first slope control portion 12B comprises a first NMOS transistor 17 having a gate electrode applied with an output signal S3 from third inverter 16, a source electrode connected to a ground potential Vss, and a drain electrode connected to the source electrode of an NMOS transistor 4, and a second NMOS transistor 18 having a gate electrode applied with a voltage source Vcc and a drain and source electrodes connected respectively to the drain and source electrodes of first NMOS transistor 17. Here, second NMOS transistor 18 operates as a constant current source.

A second control circuit 13 comprises a second delay portion 13A and a second slope control portion means 13B. Second delay portion 13A comprises a fourth inverter 19 receiving an output signal $\overline{Dd}$ from NAND gate 6, and fifth and sixth inverters 20 and 21 all connected in series to the fourth inverter 19. The second slope control portion 13B comprises a first PMOS transistor 22 having a gate electrode applied with an output signal S6 from sixth inverter 21, a source electrode applied with a voltage source Vcc, and a drain electrode connected to the source electrode of a PMOS transistor 7, and a second PMOS transistor 23 having a gate electrode applied with a ground potential Vss and a drain and source electrodes connected respectively with the drain and source electrodes of first PMOS transistor 22. Here, second PMOS transistor 23 operates as a constant current source.

Also, the number of inverters constituting the first and second delay portion in the above constitution may vary according to the characteristics of the memory devices as well as the devices constituting the first and second control circuits.

Figure 5A:
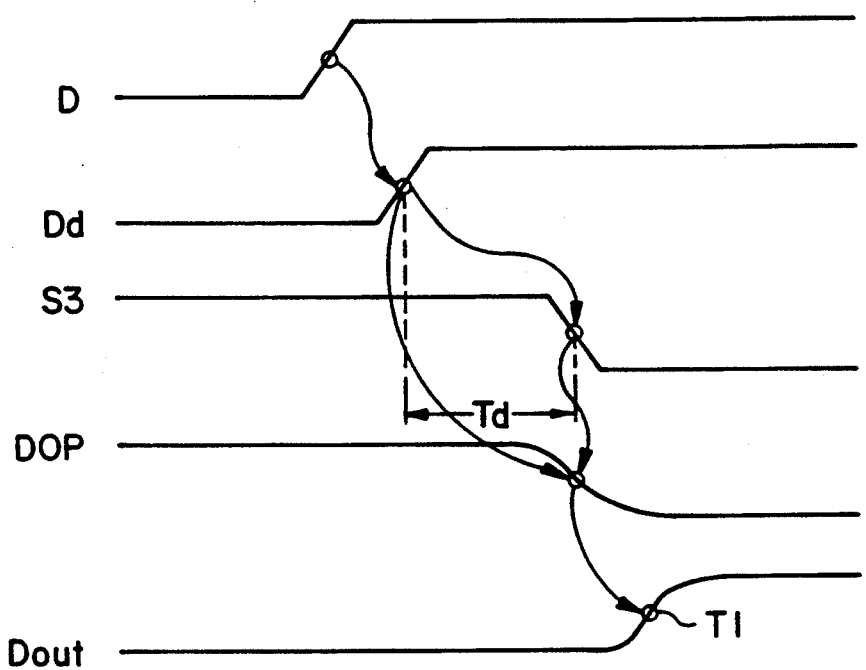
FIGS. 5A and 5B are operational timing diagrams for describing the operation of the circuit shown in FIG. 4.

FIG. 5A is an operational timing diagram for describing the operation of the circuit shown in FIG. 4 when data D undergoes a transition from low to high. Here, output enable signal OE above is again assumed to be high.

In FIG. 5A, when output signal Dd goes from low level to high level, NMOS transistor 4 turns on. At this time, since first and second NMOS transistors 17 and 18 of first slope control portion 12B become on, output signal DOP falls to a logic low level. Meanwhile, first delay portion 12A delays signal Dd for a predetermined time Td, while lowering output signal S3 to a logic low, which turns off first NMOS transistor 17 and delays the falling transition of output signal DOP to a logic low level.

Here, the falling transition of output signal DOP proceeds as rapidly as in conventional cases, until the conduction of PMOS transistor 10. However, after the conduction of PMOS transistor 10, first NMOS transistor 17 is in an "OFF" state, resulting in the output signal's slow fall to a logic low state. Accordingly, after PMOS transistor 10 is turned on, output signal Dout rises slowly to a logic high state.

Figure 5B:
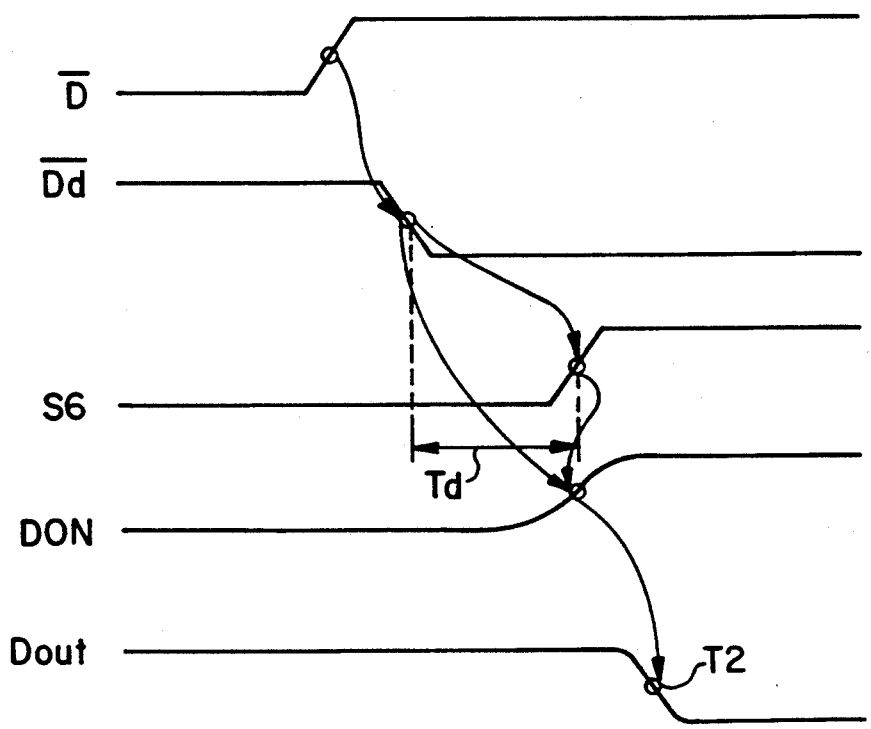

FIG. 5B is an operational timing diagram for describing the operation of the circuit shown in FIG. 4 when inverted data D undergoes a transition from low to to high. Here, it is still assumed that output enable signal OE is high.

In FIG. 5B, if output signal $\overline{Dd}$ falls from high to low, PMOS transistor 7 turns on. At this time, since first and second PMOS transistors 22 and 23 of second slope control portion 13B are on, output signal DON rises to a logic high level. Meanwhile, second delay portion 13A delays signal $\overline{Dd}$ for a specified time Td, and delays the rising transition of output signal DON to a logic high level by turning on first PMOS transistor 22.

Here, the rising transition of signal DON proceeds as rapidly as in conventional cases until NMOS transistor 11 is turned on (that is, until time T1 or T2). However, after NMOS transistor 11 is turned on, first PMOS transistor 22 is turned off, resulting in the output signal's slow rise to a logic high state. Accordingly, after NMOS transistor 11 is turned on, data output buffer signal Dout falls slowly to a logic low state.

Figure 6:
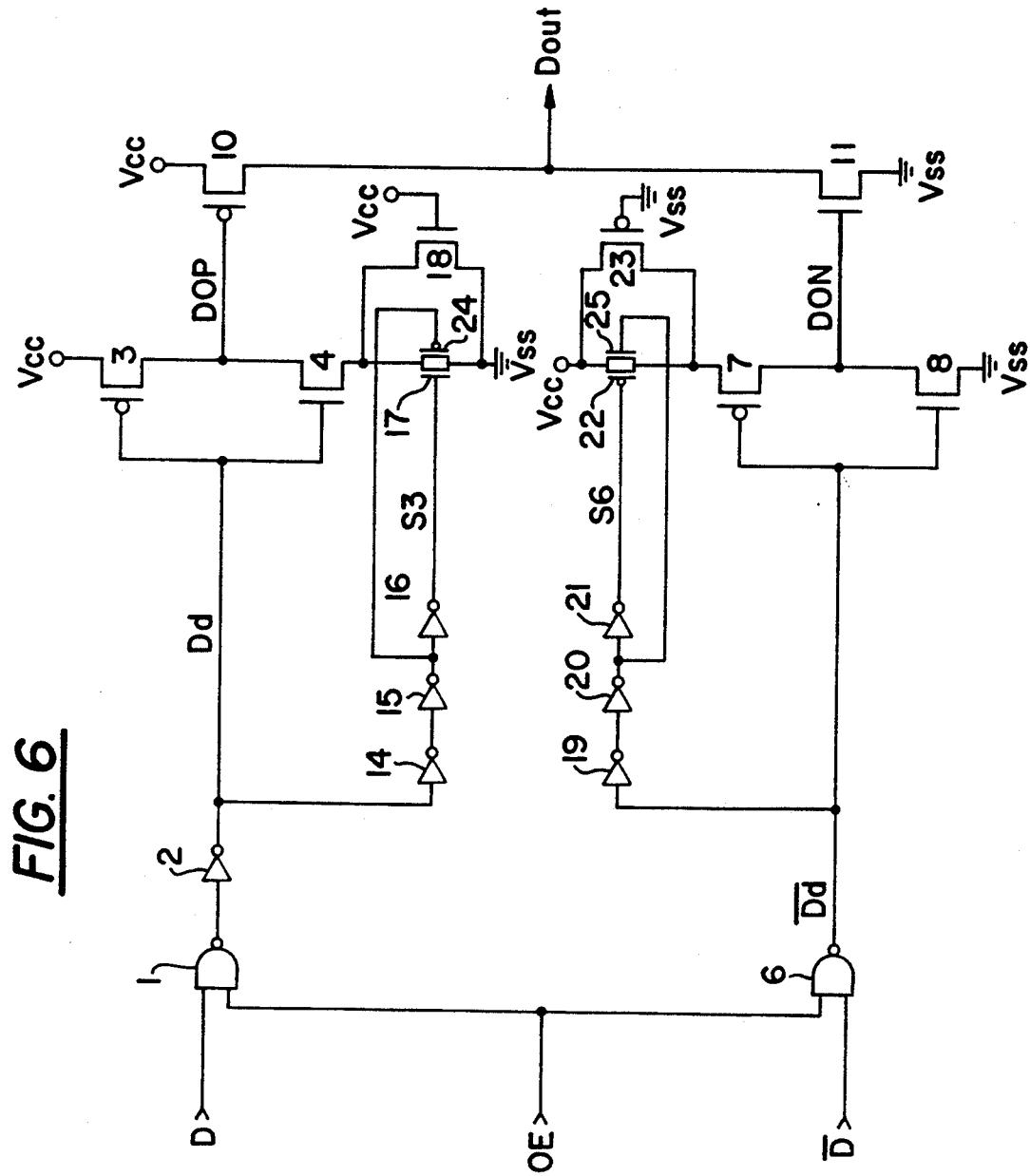
FIG. 6 shows another embodiment of a data output buffer according to this invention.

FIG. 6 shows another embodiment of a data output buffer according to this invention. In FIG. 6, a first slope control portion further comprises, as compared with the circuit of FIG. 4, a third PMOS transistor 24 having a gate electrode connected to the output terminal of a second inverter 15 and a drain and source electrodes are connected respectively to the source and drain electrodes of first NMOS transistor 17.

Further, a second slope control means further comprises, as compared with the circuit of FIG. 4, a third NMOS transistor 25 having a gate electrode connected to the output terminal of a fifth inverter 20 and a drain and source electrodes connected respectively to the source and drain electrodes of first PMOS transistor 22.

Here, the transition slopes of output signals DOP and DON become less steep by making the blocking of the first NMOS transistor and third PMOS transistor pair and that of the first PMOS transistor and third NMOS transistor pair earlier than the specified time.

Therefore, for the falling transition of output signal DOP and the rising transition of output signal DON, a data output buffer according to this invention maintains the same speed as in conventional data output buffer, until PMOS transistor 10 and NMOS transistor 11 are turned on, but allows slow changes afterwards, so that noise is reduced without affecting operation speed.

Also, if the voltage source is high and ambient temperature is low, the delay operation of the above first and second delay means proceeds rapidly, so that the transition slopes of output signals DOP and DON become less steep than when the voltage source is low and ambient temperature is high. In addition, the number of elements constituting the above first and second delay portions as well as the constitution of the first and second control circuits, may vary within the limits of the technical ideas relevant to this invention.

What is claimed is:

1. A parallel conduction path circuit connected to a fast-switching driving stage to slow down a signal switching transition period defined as the period of a logic state switching operation when an input signal received by the driving stage is inverted so as to transmit from a first steady-state logic level to a second steady-state logic level, the driving stage including one of a pull-up and a pull-down circuits and being connected to detect a transition of the input signal received at an input node thereof and in response to which said logic state switching operation is initiated, the parallel conduction path circuit comprising:
a conducting circuit portion connected to the driving stage and serving as a variable current conduction path thereto, the conducting circuit portion providing maximum current intensity during an initial period of said switching transition period and selectively providing a non-zero current intensity, which is less than the maximum current intensity, a predetermined period of time into the switching transition period; and
a delay circuit portion, coupled to the input node to receive the input signal simultaneously with the driving stage, said delay circuit portion controlling, in response to the input signal, the conducting circuit portion so as to provide the non-zero current intensity to said driving stage at the predetermined period of time into the switching transition period,
whereby the non-zero current intensity operates to provide a longer switching transition period than if the current intensity had not been reduced from the maximum intensity.

2. A parallel conduction path circuit according to claim 1, wherein said driving stage is a pull-up transistor stage of a data buffer circuit, and wherein said conducting circuit portion provides a variable current conduction path to a gate of a pull-up driving transistor associated with said pull-up transistor stage.

3. A parallel conduction path circuit according to claim 1, wherein said driving stage is a pull-down transistor stage of a data buffer circuit, and wherein said conducting circuit portion provides a variable current conduction path to a gate of a pull-down driving transistor associated with said pull-down transistor stage.

4. A parallel conduction path circuit according to claim 1, wherein said delay circuit portion includes serially-connected first, second and third inverters coupled to receive said input signal.

5. A parallel conduction path circuit according to claim 2, wherein said conducting circuit portion comprises:
a first NMOS transistor having a gate electrode coupled to receive an output signal from said delay circuit portion, a drain electrode connected to a source electrode of said driving stage and a source electrode connected to the ground potential; and
a second NMOS transistor having a gate electrode applied with a constant voltage source, and a drain electrode and a source electrode respectively connected to the drain electrode and source electrode of said first NMOS transistor.

6. A parallel conduction path circuit according to claim 3, wherein said conducting circuit portion comprises:
a first NMOS transistor having a gate electrode coupled to receive an output signal from said delay circuit portion, a drain electrode connected to a source electrode of said driving stage and a source electrode connected to a constant voltage source; and
a second NMOS transistor having a gate electrode applied with a ground potential, and a drain electrode and a source electrode respectively connected to the drain electrode and source electrode of said first NMOS transistor.

7. A parallel conduction path circuit according to claim 5, wherein said delay circuit portion includes serially-connected first, second and third inverters coupled to receive said input signal.

8. A parallel conduction path circuit according to claim 6, wherein said delay circuit portion includes serially-connected first, second and third inverters coupled to receive said input signal.

9. A parallel conduction path circuit according to claim 7, wherein said conducting circuit portion further comprises a PMOS transistor having a gate electrode receiving the output signal of said second inverter, and a drain electrode and a source electrode respectively connected to the source electrode and drain electrode of said first NMOS transistor.

10. A parallel conduction path circuit according to claim 8, wherein said conducting circuit portion further comprises a PMOS transistor having a gate electrode receiving the output signal of said second inverter, and a drain electrode and a source electrode respectively connected to the source electrode and drain electrode of said first PMOS transistor.

11. A data buffer circuit including first and second parallel conduction path circuits respectively connected to a pull-up transistor stage and a pull-down transistor stage, to slow down a signal switching transition period defined as the period of a logic state switching operation when a respective input signal received by one of the pull-up and pull-down transistor stages is respectively inverted so as to transit from a first steady-state logic level to a second steady-state logic level, each of the pull-up and pull-down transistor stages being connected to detect a transition of the respective input signal received at an input node thereof and in response to which said logic state switching operation is initiated, each of said first and second parallel conduction path circuits comprising:

a conducting circuit portion connected to the corresponding transistor stage and serving as a variable current conduction path thereto, the conducting circuit portion providing maximum current intensity during an initial period of said switching transition period and selectively providing a non-zero current intensity, which is less than the maximum current intensity, a predetermined period of time into the switching transition period; and a delay circuit portion, coupled to the input node to receive the input signal simultaneously with the driving stage, said delay circuit portion controlling, in response to the input signal, the conducting circuit portion so as to provide the non-zero current intensity to said driving stage at the predetermined period of time into the switching transition period, whereby the non-zero current intensity operates to provide a longer switching transition period than if the current intensity had not been reduced from the maximum intensity.

12. A parallel conduction path circuit according to claim 11, wherein said conducting circuit portion associated with the pull-up transistor stage of said data buffer circuit comprises:

a first NMOS transistor having a gate electrode coupled to receive an output signal from the delay circuit portion associated with the pull-up transistor stage, a drain electrode connected to a source electrode of said pull-up transistor stage and a source electrode connected to the ground potential; and a second NMOS transistor having a gate electrode applied with a constant voltage source, and a drain electrode and a source electrode respectively connected to the drain electrode and source electrode of said first NMOS transistor; and wherein said conducting circuit portion associated with the pull-down transistor stage of said data buffer circuit comprises:

a first PMOS transistor having a gate electrode coupled to receive an output signal from the delay circuit portion, a drain electrode connected to a source electrode of said driving stage and a source electrode connected to a constant voltage source; and a second PMOS transistor having a gate electrode applied with a ground potential, and a drain electrode and a source electrode respectively connected to the drain electrode and source electrode of said first NMOS transistor.

13. A parallel conduction path circuit according to claim 12, wherein each corresponding delay circuit portion includes serially-connected first, second and third inverters coupled to receive the corresponding input signal.

14. A parallel conduction path circuit according to claim 13, wherein the conducting circuit portion associated with said first pull-up transistor stage further comprises a PMOS transistor having a gate electrode receiving the output signal of said second inverter, and a drain electrode and a source electrode respectively connected to the source electrode and drain electrode of said first NMOS transistor; and wherein the conducting circuit portion associated with said pull-down transistor stage further comprises a NMOS transistor having a gate electrode receiving the output signal of said second inverter, and a drain electrode and a source electrode respectively connected to the source electrode and drain electrode of said first PMOS transistor.

* * * * *